United States Patent [19]
Dent

[11] Patent Number: 5,276,764
[45] Date of Patent: Jan. 4, 1994

[54] METHOD AND DEVICE FOR COMPRESSING AND EXPANDING AN ANALOG SIGNAL

[75] Inventor: Paul W. Dent, Cary, N.C.

[73] Assignee: Ericsson-GE Mobile Communications Holding Inc., Paramus, N.J.

[21] Appl. No.: 713,776

[22] Filed: Jun. 12, 1991

[30] Foreign Application Priority Data

Jun. 26, 1990 [SE] Sweden .................. 9002254

[51] Int. Cl.⁵ .................................. G10L 3/02
[52] U.S. Cl. ........................ 395/2; 381/106; 341/143
[58] Field of Search ............. 395/2; 381/47, 46, 94, 381, 104, 106, 108, 341.143, 364.602, 606, 807, 825, 850/104, 106–; 341/143; 364/602, 606, 807, 825, 850

[56] References Cited

U.S. PATENT DOCUMENTS

| | | | |
|---|---|---|---|
| 2,967,992 | 1/1961 | Scholten | 381/106 |
| 3,602,818 | 8/1971 | Carrette et al. | 381/107 |
| 3,949,299 | 4/1976 | Song | 341/143 |
| 4,455,676 | 6/1984 | Kaneda | 381/106 |
| 4,493,091 | 1/1985 | Gundry | 381/106 |
| 4,996,696 | 2/1991 | McCabe | 341/143 |
| 5,079,550 | 1/1992 | Sooch et al. | 341/143 |
| 5,124,703 | 6/1992 | Kaneaki et al. | 341/143 |

FOREIGN PATENT DOCUMENTS

0046139 12/1985 Japan ................. 381/106

OTHER PUBLICATIONS

*Electronics*, "Audio Compander Squelches Hiss and Hum Better Than Dolby System", vol. 52, No. 4, pp. 70, 72.

*Primary Examiner*—David D. Knepper
*Attorney, Agent, or Firm*—Burns, Doane, Swecker & Mathis

[57] ABSTRACT

A device and a method for processing an analog input signal (S) which varies widely in amplitude, such as speech, for the purpose of reducing the ratio of maximum to minimum amplitude variations of an output signal (P), after the processing, to the square root of the ratio existing before processing in order better to transmit said signal through a channel of restricted dynamic range in the presence of additive noise. The device comprises a converter (2) arranged to change the input signal (S) into a stream of integer numbers (N1,N2,N3 . . .). The numbers in the stream represent in some proportional way the instantaneous value of the input signal (S) divided by a reference voltage (R). This reference voltage (R) is generated by a smoothed amplitude measuring device (4) in proportion to the amplitude of the output signal (P) that is produced, when the number stream is reconverted to an analog signal waveform by means of a converter (6) working with a constant reference voltage. A device and a method for processing a signal of compressed amplitude variation, such as might be produced by the method and device described above, in order to produce a signal of amplitude variation restored to the normal range, being the square of the compressed range is also disclosed.

12 Claims, 6 Drawing Sheets

COMPANDOR

METHOD AND DEVICE FOR COMPRESSING AND EXPANDING AN ANALOG SIGNAL

TECHNICAL FIELD

The present invention according to a first aspect relates to a device for processing an analog input signal varying widely in amplitude, such as speech, and having a first ratio of maximum to minimum amplitude variations, comprising means for reducing said first ratio into a second ratio being the square root of said first ratio, and for delivering an analog output signal having said second ratio.

Also, according to the first aspect, the invention furthermore relates to a method for processing an analog input signal varying widely in amplitude, such as speech, and having a first ratio of maximum to minimum amplitude variations, comprising the steps of reducing said first ratio into a second ratio being the square root of said first ratio, and delivering an analog output signal having said second ratio.

More particularly, said processing aims at reducing the ratio of maximum to minimum amplitude variations at the output of the processing to the square root of the ratio existing before processing in order better to transmit said signal through a channel of restricted dynamic range in the presence of additive noise.

According to a second aspect the invention also relates to a device and a method for processing an input signal having a compressed amplitude range in order to produce an output signal having an amplitude range being the square of the compressed range. More particularly, said input signal can be one as produced as the output signal in accordance with the first aspect.

STATE OF THE ART

The quality of voice transmission over a communications network that suffers from transmission noise, such as exemplified by a radio link, may be described and measured in terms of signal-to-noise ratio (SNR). Because a real voice signal is not of constant amplitude, but varies more or less randomly over a wide dynamic range, it is not a convenient test signal with which to carry out SNR measurements. Instead, constant-level tones of various frequencies in the audio range are usually employed for this purpose, and the resulting measurement is called TTNR (Test Tone to Noise Ratio).

The subjectively perceived quality of speech is, however, better described by the ratio of peak speech loudness to noise during silence periods, a measure which is not described by TTNR. A better measure of subjective quality would be the ratio of the switched on test tone level to residual noise with the test tone switched off. It is in order to optimize this more subjectively important quality aspect, a technique known as companding is often employed.

Companding comprises a variable gain control at the transmit end arranged either to increase the transmitted level during quiet periods and/or to reduce the level during loud periods, so that the total dynamic range of the signal is compressed/companded towards a mean. At the receive end, a decompandar or expandor performs the inverse scaling, increasing the level during loud periods to restore the original dynamic signal excursion and likewise decreasing the level during quiet periods. In the latter case, any noise added in transmission is also reduced during the quiet periods, exactly as required to maximize the perceived quality.

A commonly used companding law is the so-called square-root law, in which the amplitude of the signal actually transmitted is proportional to the square-root of the amplitude at the source. For example, during a period in which the speech source material momentarily had an amplitude of 1/100th of a unit, the transmitted amplitude would be raised to 1/10th by the compandor. Likewise, during a period of source amplitude of 9 units, the transmitted amplitude would be reduced to 3 units, while unit amplitude by definition is that level which remains unchanged through the compandor. Suppose now that the noise added in transmission corresponds to 1/100th of an amplitude unit. In the quiet period when 1/10th was transmitted, the received signal would consist of 1/10th of a unit of wanted signal plus 1/100th of a unit of noise. Upon the decompandor reducing the 1/10th unit signal to its original 1/100th unit, the noise would be reduced by the same factor from 1/100th to 1/10,000th. In the case of a zero level wanted signal, the compandor would interpret the 1/100th unit received noise as a companded signal level, and restore it to what it believed the original signal level to have been, namely 1/10,000th.

It can be seen therefore that the noise level during silent periods at the output of the decompandor is the square of the value it otherwise would have been without the use of companding and decompanding.

SNR is often measured on the logarithmic scale of decibels, defined by dBs=20LOG (SIGNAL AMPLITUDE/NOISE AMPLITUDE)

If the mean signal amplitude during active speech is taken to be 1, and the noise amplitude in quiet periods is equal to 1/100 without companding, then the SNR calculated by the above formula is 40 dB.

With companding/decompanding, the noise in silence periods is reduced to 10,000, giving an SNR of 80 dB, a considerable improvement in subjective quality.

In two prior methods for performing square-root companding, known as the feedforward and feedback methods, respectively, a respective companded output signal is obtained by dividing the input signal by a value obtained, in the feed forward case, through amplitude measurement, smoothing and square root processing of the input signal, and, in the feed back case, through amplitude measurement and smoothing of the companded output signal, respectively.

The feedback method has the advantage that the square-root function is not explicitly needed, and also that the amplitude measurement takes place on the companded output, halving the signal range in dBs that the measuring device need handle. The square root companding law arises because the output amplitude is the input amplitude divided by the output amplitude.

Two known implementations of a compandor of the latter type exist. The first one is a fully analog circuit implementation in which the dividing circuit would most probably be implemented by using an analog multiplier in a feedback loop. The second one is a full digital implementation in which the input signal is first digitized using an analog-to-digital converter, then fed into a digital signal processing circuit which would numerically implement a companding algorithm of either the feedback or feedforward variety. The result must then be converted back to an analog signal again using a digital-to-analog convertor.

The known implementations each have their own drawbacks. The drawback of the fully analog system is that some tight tolerance components are needed, which are difficult to fabricate in semiconductor integrated circuits. The drawback of the fully digital implementation is the need for quite complex A-to-D and D-to-A converters, plus a costly and power-consuming digital signal processor chip.

THE INVENTION

It is an object of the present invention to provide a new way to implement square-root law companding which has the advantage of being more easily integrated into low-cost silicon integrated circuits using low-cost semiconductor processes. This object has been attained as follows by means of the devices and methods according to the first and second aspects of the invention:

The device according to the first aspect of the invention comprises an analog-to-digital converter for changing an input signal into a stream of integer numbers representing in a proportional way the instantaneous value of the input signal divided by a first reference voltage, means for generating said first reference voltage in proportion to the amplitude of an output signal, and a digital-to-analog converter for reconverting said stream of numbers to an analog signal waveform in proportion to a constant reference voltage, said analog waveform forming said output signal.

The method according to the first aspect of the invention comprises the steps of changing an input signal into a stream of integer numbers representing in a proportional way the instantaneous value of the input signal divided by a first reference voltage generated in proportion to the amplitude of an output signal, and reconverting said stream of numbers to an analog signal waveform in proportion to a constant reference voltage, said analog waveform forming said output signal.

The device according to the second aspect of the invention comprises an analog-to-digital converter having means for changing said input signal into a sequence of integer numbers, said sequence in a proportional way representing said input signal, a digital-to-analog converter for converting back said sequence of numbers to an analog signal forming said output signal, said converter having means for scaling said, output signal in proportion to a reference voltage, and means for deriving said reference voltage in response to the amplitude of said input signal.

The method according to the second aspect of the invention comprises the steps of changing an input signal into a sequence of integer numbers, said sequence in a proportional way representing said input signal, and converting back said sequence of numbers to an analog signal forming an output signal, while scaling said output signal in proportion to a reference voltage derived in response to the amplitude of said input signal.

DESCRIPTION OF THE DRAWINGS

Embodiments of the invention will now be described more closely below with reference to the accompanying schematical drawings, on which

PREFERRED EMBODIMENTS

Figure 1:
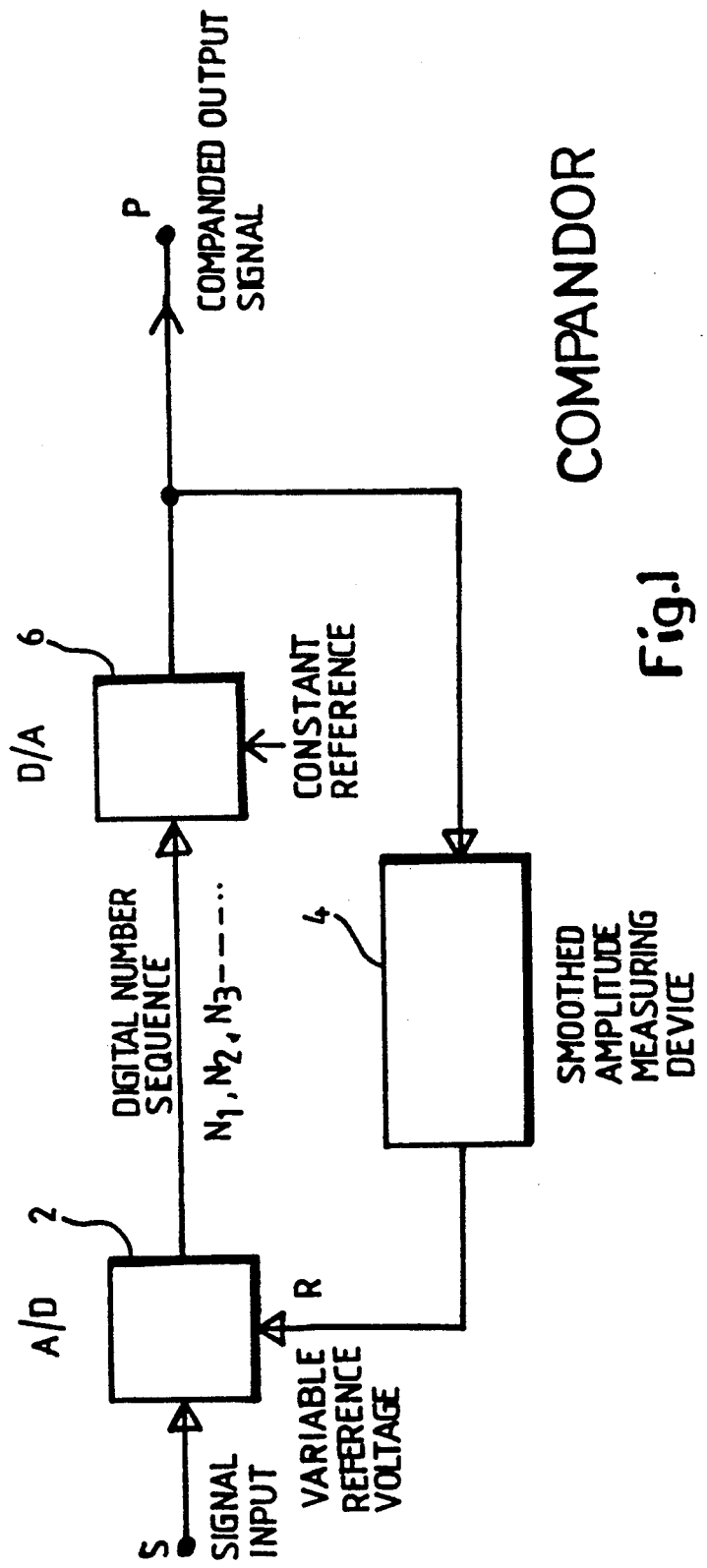
FIGS. 1 and 2 are generic block diagrams of two aspects of the present invention, FIGS. 3-8 schematically illustrate different circuit solutions for the blocks included in FIGS. 1 and 2, and more particularly.

FIG. 1 in block diagram form illustrates a device for processing an analog input signal S which varies widely in amplitude, such as speech. The purpose of this device is to reduce the ratio of maximum to minimum amplitude variations of an output signal P, after the processing, to the square root of the ratio existing before processing in order better to transmit said signal through a channel of restricted dynamic range in the presence of additive noise.

The device comprises an analog-to-digital converter 2 arranged to change, as will be described more closely below, the signal S into a stream of integer numbers N1,N2,N3 . . . These numbers may in the limit consist of only two possible values, such as plus one and minus one. The numbers in the stream represent in some proportional way the instantaneous value of the input signal S divided by a reference voltage R. This reference voltage R is generated by a smoothed amplitude measuring device 4 in proportion to the amplitude of the output signal P that is produced, in a manner to be described more closely below, when the number stream is reconverted to an analog signal waveform by means of an digital-to-analog converter 6 working with a constant reference voltage.

Figure 2:
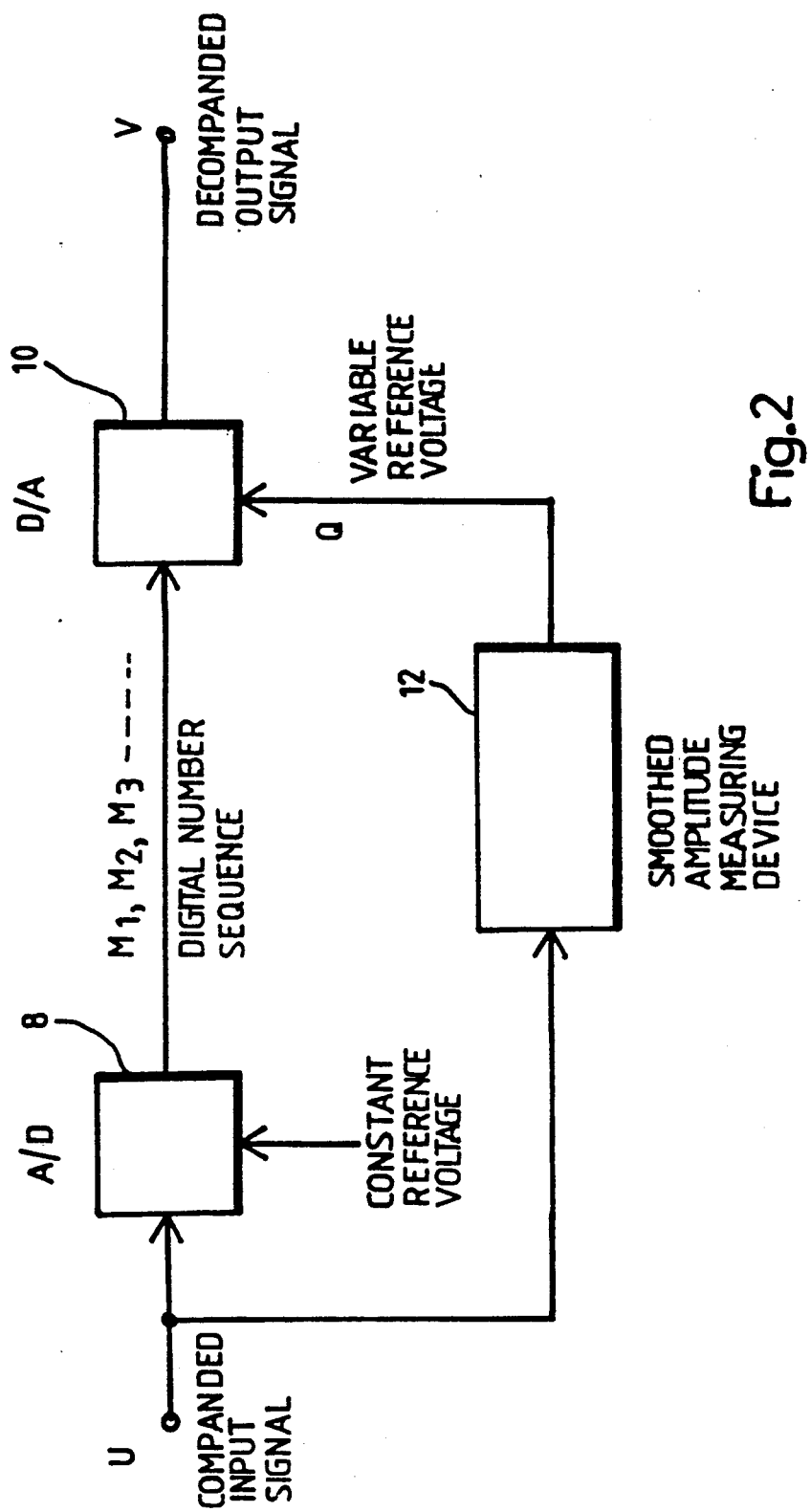

FIG. 2 schematically illustrates a device, complementary to that of FIG. 1, for processing a signal U of compressed amplitude variation, such as might be produced by the device of FIG. 1. The purpose of the device of FIG. 2 is to produce a signal V of amplitude variation restored to the normal range, being the square of the compressed range.

The device comprises an analog-to-digital converter 8 that turns said compressed input signal U into a sequence of integer numbers M1,M2,M3 . . . These numbers may in the limit be restricted to only two possible values, such as plus one and minus one. The sequence in a proportional way represents the signal U, and is converted back to an analog signal V by means of a digital-to-analog converter 10. The converter 10 scales the output signal V in proportion to a reference voltage Q derived by determining the amplitude of input signal U with a measuring device 12, which may include smoothing of the measurement by means of a low-pass filter.

According to one important embodiment of the present invention, the technique used for converters 2, 6, 8 and 10 may be of the type known as Delta modulation, Delta-Sigma modulation or one of their variants.

A Delta modulation encoder digitizes an analog signal into a sequence of 1-bit binary numbers, representing +1 or −1. The values are used to change the direction of a ramp generator, or integrator, so that it ramps up if the previous value was lower than the input signal, or ramps down if the previous value was too high. The amount the integrator ramps up or down between samples is called the step size. If the 1-bit samples are generated at a high rate, the steps needed to follow a signal changing at a given rate will be smaller, and the step approximation to the signal waveform will thus be more accurate. The coarseness of 1-bit quantization may thus be compensated by raising the sample bit-rate sufficiently to obtain the desired accuracy.

Figure 3:
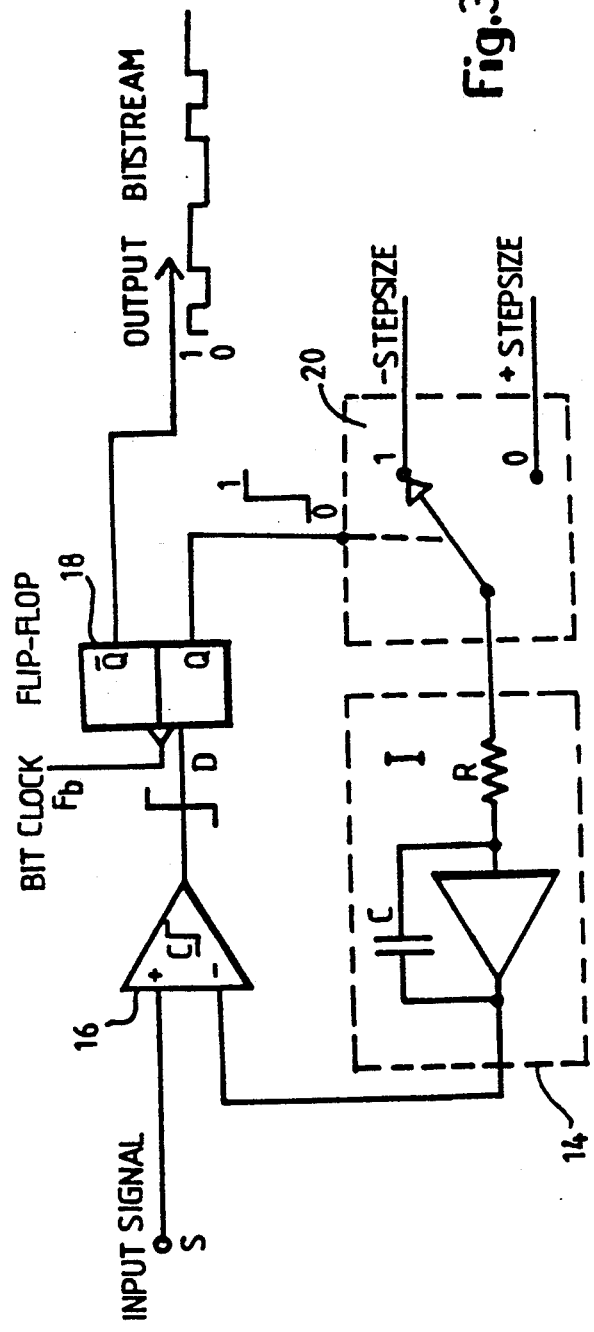
FIGS. 3 and 4 illustrate a Delta modulation encoder and decoder, respectively.

FIG. 3 shows an integrator 14, the output signal of which is compared with the input signal S in a comparator 16. The decision D is taken at a certain bit rate Fb by clocking into a latch or flip-flop 18 upon positive going edges of a clock of frequency Fb. The clocked decision is then fed to a switch 20 to effect selection of the direction in which the integrator 14 will change during the next sample period. The magnitude of the change is determined by the value STEPSIZE.

In another known system, the value of STEPSIZE is increased whenever the integrator is ramped in the same direction three times in succession, an event which hints that the rate of change of signal is greater than the integrator can follow with the present STEPSIZE. This known system is called "companded Delta modulation" and also CVSD (Continuously Variable Slope Delta).

Figure 4:
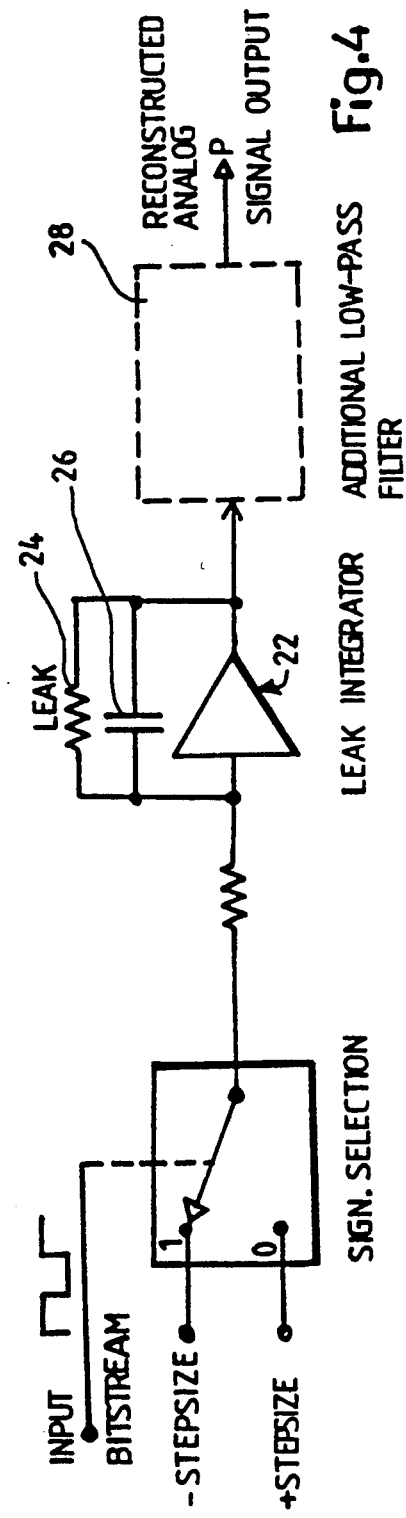

With reference to FIG. 4, Delta modulation is reconstructed to an analog signal by feeding it to an integrator 22 similar to that employed in the encoder. A difference between the encoder integrator 14 and the reconstruction integrator 22 is that the latter must include some form of leakage, e.g. a resistor 24 connected across the integration capacitor 26, to define the arbitrary constant of integration to be zero (i.e. to cause the arbitrary start-up charge state to decay with time).

After reconstruction by a leaky integrator, high frequency quantization noise may be further reduced by a low pass filter which passes the highest likely signal frequencies, but which attenuates noise frequencies in the region of the sample bit-rate and higher.

Figure 5:
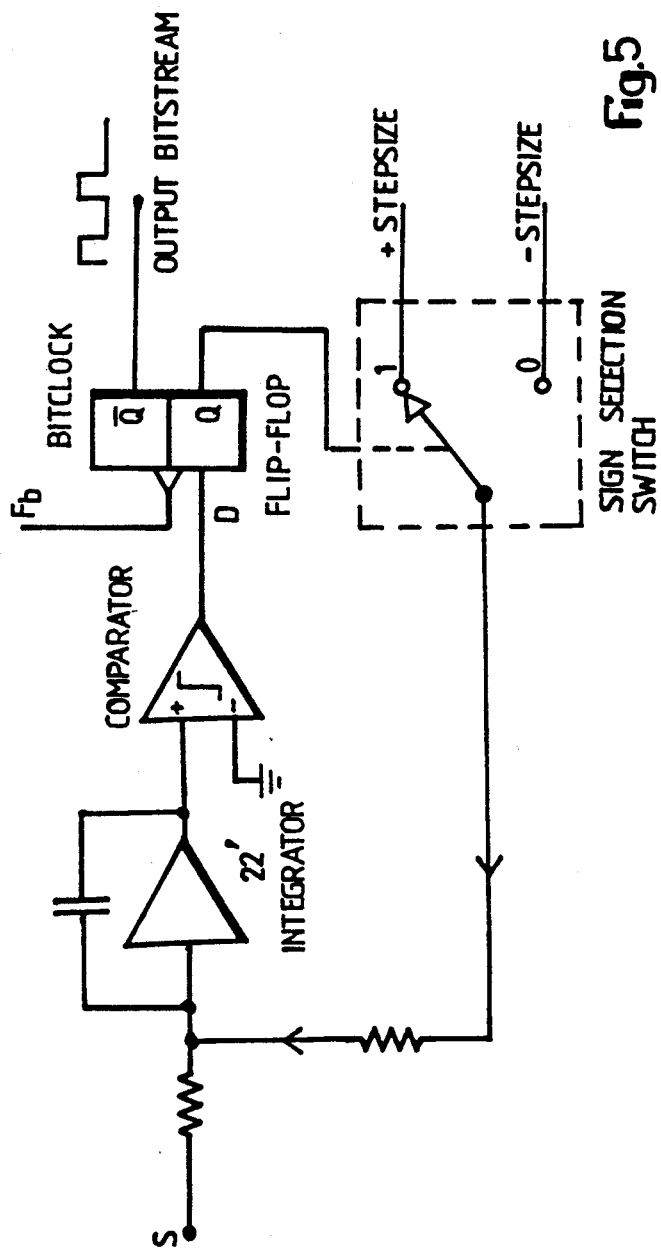
FIGS. 5 and 6 illustrate a Delta-Sigma or Sigma-Delta encoder and decoder, respectively.
Figure 6:
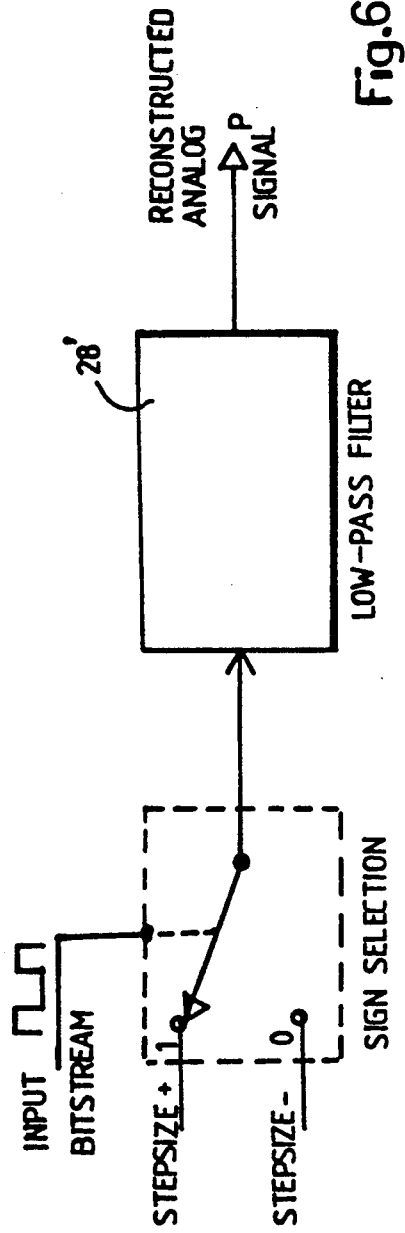

The use of a related algorithm known as Sigma-Delta or Delta-Sigma modulation is illustrated in FIGS. 5 and 6. The difference is that the input signal S is applied before the integrator, here designated 22', instead of afterwards. The signal suffers an extra integration in the encoder compared to Delta modulation, which is then removed at the decoder shown in FIG. 6 by omitting the reconstruction integrator 22, and using only low-pass filtering at 28'. Delta-Sigma modulation represents values between +and−STEPSIZE by alternating between them in the correct mean ratio, and in this respect is similar to pulse width modulation.

Delta or Delta-Sigma modulation schemes may also include more than one integrator or other frequency response shaping in the feedback loop, and the signal may or may not pass through one or more of these components. It is also possible to construct Delta modulation encoders and decoders in which the error between the integrator value and the input signal value is quantized to more than one bit, and is then known as delta-PCM.

The design details of all such variants need not be described here since they may, be found in the technical literature. Any scheme characterized by an encoder which digitizes the input signal with a scaling determined by the value of STEPSIZE or similar reference voltage, which can be allowed to vary in response to the signal, and which digitized signal may readily be converted back to an analog signal using either the same or different, constant or variable stepsize or reference voltage may be suitable for the implementation of the invention.

Both variable and constant stepsize can be used with the invention. If the signal is encoded using a small stepsize and decoded using a large stepsize, its amplitude will have been increased. If the encoding stepsize is larger than the decoding stepsize, the amplitude will be reduced. If therefore the encoding stepsize is varied while the decode stepsize is kept constant, the signal level output will bear an inverse relationship to the stepsize, thus realizing a divide function, as required by the square-root compandor.

Figure 7:
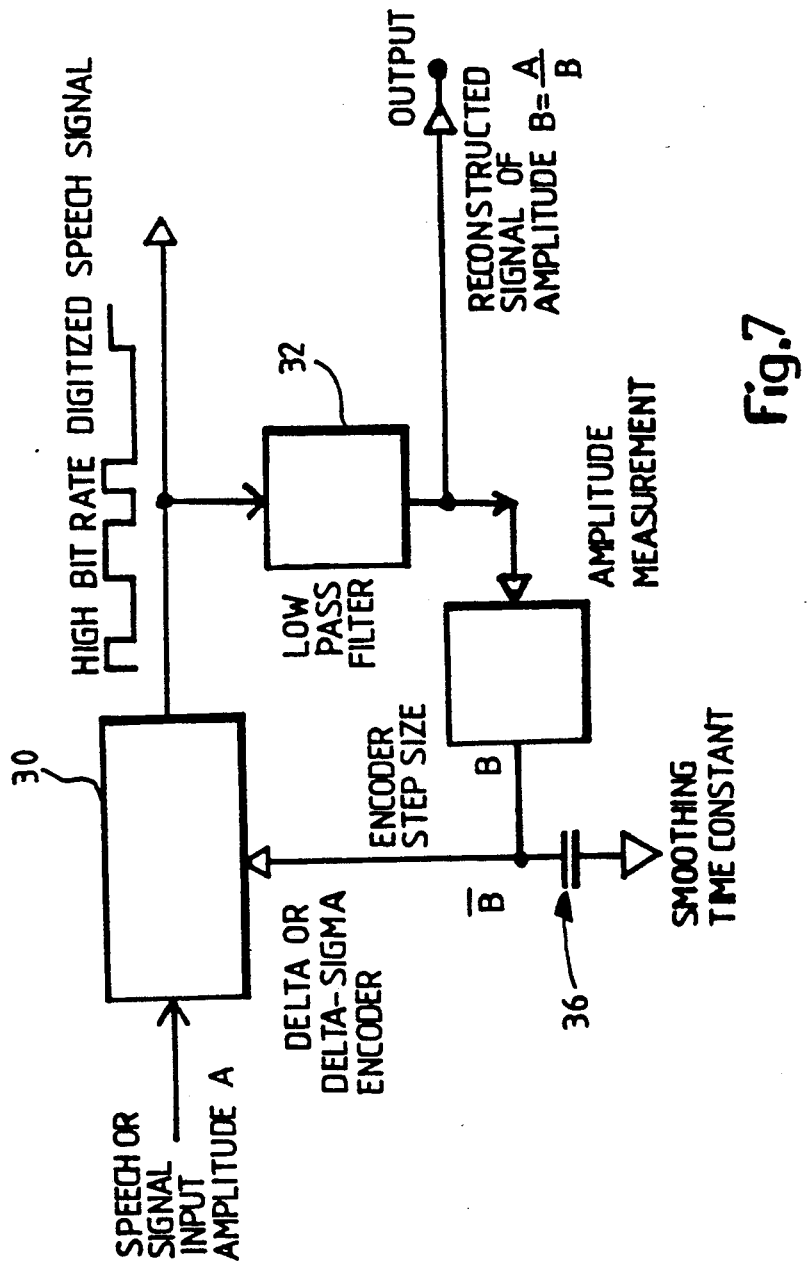
FIG. 7 illustrates companding by use of variable stepsize Delta or Delta-Sigma modulation.

It is only necessary therefore to make the stepsize proportional to the companded output signal amplitude by deriving it from an amplitude measurement as shown in FIG. 7.

FIG. 7 shows by way of example an encoder 30 of Delta or Delta-Sigma type and of 1-bit quantization. The constant-stepsize decoder is then simply a low-pass filter 32. The variable stepsize for the encoder is derived by measuring at 34 the amplitude of the companded signal reconstructed into analog form by the low-pass filter. The amplitude measurement is subject to a further low-pass filtering operation, or smoothing time constant at 36, called the companding time constant. This is defined in various international standards that employ companding for voice transmission.

Figure 8:
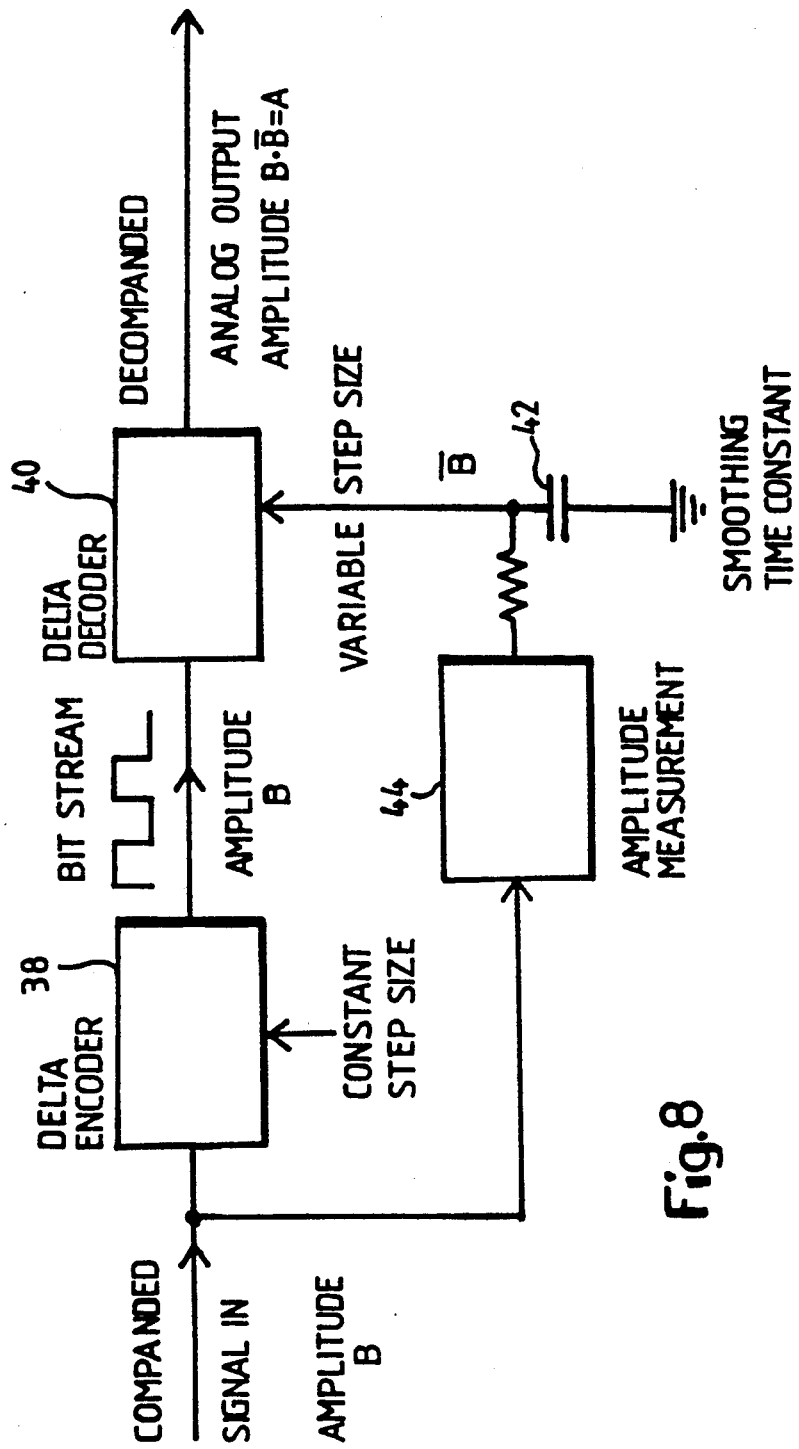
FIG. 8 illustrates decompanding by encoding with constant stepsize and decoding with varable stepsize.

The corresponding decompanding circuit is shown in FIG. 8. In this case, the companded input signal is encoded at 38 with constant step size to return it to digital form, then decoded at 40 back to analog form but using variable stepsize proportional to the smoothed input amplitude. For correct system performance, the low-pass filter or time constant used at 42 to smooth the amplitude measurement at 44 in the decompandor should be identical to that used in the compandor.

I claim:

1. A device for processing an analog input signal varying widely in amplitude and having a first ratio of maximum to minimum amplitude variations, by reducing said first ratio into a second ratio being the square root of said first ratio, and for delivering an analog output signal having said second ratio, comprising:

a first converter for changing said input signal into a stream of integer numbers representing in a proportional way the instantaneous value of the input signal divided by a first reference voltage, means for generating said first reference voltage in proportion to the amplitude of said output signal, and a second converter for recovering said stream of numbers to an analog signal waveform in proportion to a constant reference voltage, said analog waveform forming said output signal.

2. A device according to claim 1, wherein said integer numbers consist of only two possible values.

3. A device according to claim 1, wherein said first reference voltage (R) is generated by a smoothed amplitude measuring device.

4. A device according to claim 1, wherein said first converter comprises an encoder working in accordance with a technique known as Delta modulation, Delta-Sigma modulation or variants thereof, said encoder having
means for quantizing said input signal to only one binary bit resolution,
means for increasing the sample rate to obtain a predetermined accuracy, and means for determining the step size of said encoder in response to said first reference voltage, and said second converter having a decoder for the quantized signal operated with constant step size.

5. A device for processing an input signal having a compressed amplitude range in order to produce an output signal having an amplitude range being the square of the compressed range, comprising:

a first converter having means for changing said input signal into a sequence of integer numbers, said sequence in a proportional way representing said input signal, a second converter for converting back said sequence of numbers to an analog signal forming said output signal, said converter having means for scaling said output signal in proportion to a reference voltage, and means for deriving said reference voltage in response to the amplitude of said input signal.

6. A device according to claim 5, wherein said sequence of interger numbers is restricted to only two possible values. one].

7. A device according to claim 5, wherein the amplitude of said input signal is determined with a measuring device including a low pass filter for smoothing the measurement.

8. A device according to claim 5, wherein said first converter and said second converter an encoder and a decoder, respectively, working in accordance with a technique known as Delta modulation, Delta-Sigma modulation or variants thereof, said encoder having means for producing said output number sequence as containing single-bit binary numbers representing only two possible values, and in a proportional way representing the instantaneous value of said input signal, and means for compensating the coarse two-level quantization thereby obtained by increasing the sample conversion rate to obtain a predetermined accuracy, and said decoder receiving an output produced by the encoder and converting said output back to an analog signal waveform, and having means for producing said output signal by scaling said analog waveform in porportion to said reference signal by using the latter to determine the step size of said decoder.

9. A method for processing an analog input signal varying widely in amplitude and having a first ratio of maximum to minimum amplitude variations, by reducing said first ratio into a second ratio being the square root of said first ratio, and delivering an analog output signal having said second ratio, comprising the steps of:

changing said input signal into a stream of integer numbers representing in a proportional way the instantaneous value of the input signal divided by a first reference voltage generated in proportion to the amplitude of said output signal, and reconverting said stream of numbers to an analog signal waveform in proportion to a constant reference voltage, said analog waveform forming said output signal.

10. A method according to claim 9, wherein said integer numbers consists of only two possible values.

11. A method for processing an input signal having a compressed amplitude range in order to produce an output signal having an amplitude range being the square of the compressed range, comprising the steps of:

changing said input signal into a sequence of integer numbers, said sequence in a proportional way representing said input signal, converting back said sequence of numbers to an analog signal forming said output signal, while scaling said output signal in proportion to a reference voltage derived in response to the amplitude of said input signal.

12. A method according to claim 11, wherein said sequence of integer numbers is restricted to only two possible values.

* * * * *